US011521873B2

(12) United States Patent
Saeki et al.

(10) Patent No.: US 11,521,873 B2
(45) Date of Patent: Dec. 6, 2022

(54) PROCESSING INFORMATION MANAGEMENT SYSTEM AND METHOD FOR MANAGING PROCESSING INFORMATION

(71) Applicant: KIOXIA CORPORATION, Tokyo (JP)

(72) Inventors: Hidekazu Saeki, Yokkaichi Mie (JP); Kenta Kawamura, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 503 days.

(21) Appl. No.: 16/791,489

(22) Filed: Feb. 14, 2020

(65) Prior Publication Data
US 2021/0090921 A1    Mar. 25, 2021

(30) Foreign Application Priority Data
Sep. 19, 2019 (JP) .............................. JP2019-170545

(51) Int. Cl.
*H01L 21/67* (2006.01)
*G05B 19/418* (2006.01)
*G01R 31/28* (2006.01)

(52) U.S. Cl.
CPC .... *H01L 21/67288* (2013.01); *G01R 31/2831* (2013.01); *G05B 19/41875* (2013.01); *H01L 21/67092* (2013.01); *H01L 21/67259* (2013.01); *G05B 2219/32368* (2013.01); *G05B 2219/45031* (2013.01)

(58) Field of Classification Search
None
See application file for complete search history.

(56) References Cited

U.S. PATENT DOCUMENTS 8,188,447 B2 * 5/2012 Yang ..................... H01L 22/20
438/149
2020/0312778 A1 * 10/2020 Lim ..................... H01L 22/20

FOREIGN PATENT DOCUMENTS

| JP | 5134216 B2 | 1/2013 |
| JP | 2017-185599 A | 10/2017 |
| JP | 2018-195618 A | 12/2018 |

* cited by examiner

*Primary Examiner* — Sean Shechtman
(74) *Attorney, Agent, or Firm* — Foley & Lardner LLP

(57) ABSTRACT

According to one embodiment, a processing information management system includes: an abnormality analyzer configured to generate abnormality occurrence data of a target wafer based on processing location information, the processing location information collected based on a first sensor outputting a first sensor signal according to a detected processing state, the first sensor provided in a wafer processing apparatus; and an integration system configured to integrate the abnormality occurrence data into wafer map data corresponding to the target wafer.

14 Claims, 9 Drawing Sheets

PROCESSING INFORMATION MANAGEMENT SYSTEM AND METHOD FOR MANAGING PROCESSING INFORMATION

CROSS-REFERENCE TO RELATED APPLICATION(S)

This application is based upon and claims the benefit of priority from Japanese Patent Application No. 2019-170545, filed on Sep. 19, 2019, the entire contents of which are incorporated herein by reference.

FIELD

Embodiments described herein relate generally to a processing information management system and a method for managing processing information.

BACKGROUND

In the related art, semiconductor devices such as an integrated circuit (IC) and a large-scale integrated circuit (LSI) formed on a wafer have been diced by a blade of a dicing apparatus and divided into individual chips.

When dicing the semiconductor devices with a dicing apparatus, chipping (wafer chipping) may occur on a cut surface, or a hairline which is a reference line of a camera of the dicing apparatus and a position of a center line of the blade may be misaligned, and the actual position of a cutting groove may be misaligned.

DETAILED DESCRIPTION

When a chipping or a misalignment occurs, the state may be detected by a sensor provided in the dicing apparatus. However, it may not be said that such information has been effectively used in an inspection apparatus that performs an inspection after dicing processing or other processing apparatuses that perform a processing after dicing processing in a semiconductor manufacturing system.

Embodiments provide a processing information management system and a processing information management method that make it possible to effectively utilize abnormality information such as chipping obtained in the dicing apparatus at a post-stage inspection apparatus or processing apparatus, and further to improve the efficiency and speed of processing in a post-stage inspection apparatus or processing apparatus.

In general, according to one embodiment, the processing information management system includes: an abnormality analyzer configured to generate abnormality occurrence data of a target wafer based on processing location information, the processing location information collected based on a first sensor outputting a first sensor signal according to a detected processing state, the first sensor provided in a wafer processing apparatus; and an integration system configured to integrate the abnormality occurrence data into wafer map data corresponding to the target wafer.

Next, embodiments will be described in detail with reference to the drawings.

[1] First Embodiment

Figure 1:
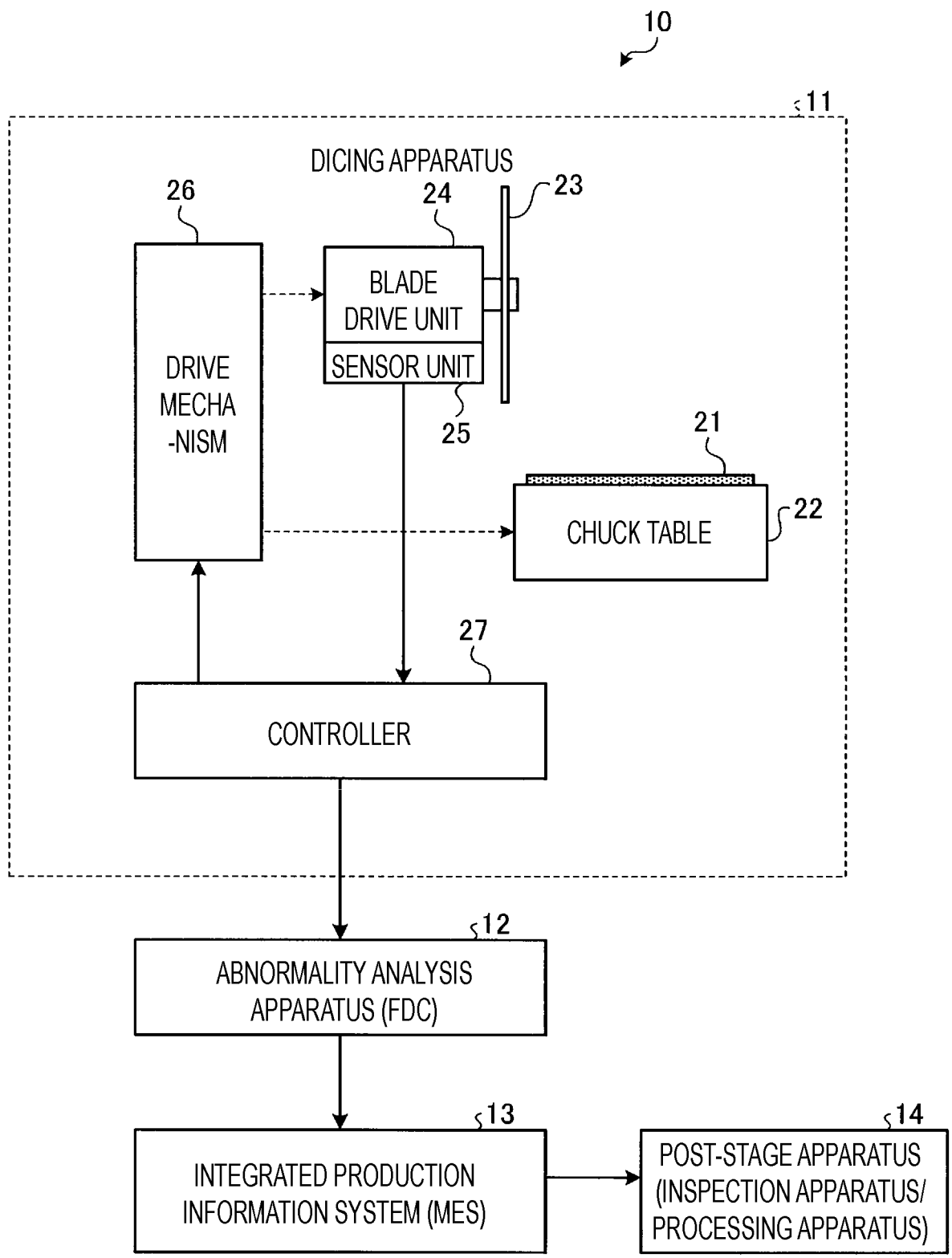
FIG. 1 is a schematic configuration block diagram of a semiconductor processing system according to a first embodiment.

FIG. 1 is a schematic configuration block diagram of a semiconductor processing system according to a first embodiment.

A semiconductor processing system 10 is broadly divided into a dicing apparatus 11 that performs dicing of a wafer, an abnormality analysis apparatus 12 that performs an abnormality analysis during dicing, an integrated production information system (MES: Manufacturing Execution System) 13 that manages analysis result information of the abnormality analysis apparatus 12 as production information, and a post-stage apparatus 14 configured as an inspection apparatus or a processing apparatus that performs an inspection or a processing in any process after dicing processing in semiconductor manufacturing.

The dicing apparatus 11 includes a chuck table 22 that holds a wafer 21 by a vacuum suction mechanism or the like during dicing, a blade 23 that cuts the wafer 21, a blade drive unit 24 that rotationally drives the blade 23, a sensor unit 25 that detects a state of the blade 23 at a processing point (cutting point), a drive mechanism 26 that drives the blade drive unit (and the sensor unit 25) and the chuck table 22, and a controller 27 that controls the entire dicing apparatus 11 and communicates with the outside.

In the above configuration, the sensor unit 25 constitutes the blade drive unit 24 and detects a spindle resistance, which is a resistance value of a spindle motor that rotationally drives the blade 23 (not illustrated), a driving current value of the spindle motor, and the like.

Further, the drive mechanism 26 is driven so as to control a relative position relationship between the blade drive unit (and the sensor unit 25) and the chuck table 22, or rotationally drives the chuck table 22 and causes the blade 23 to dice at a desired position of the wafer 21.

In addition, the controller 27 grasps or otherwise collects the processing location information of the blade 23 based on the output signal of the sensor unit 25 and the control information of the drive mechanism 26, and outputs such information to the abnormality analysis apparatus 12.

Next, the operation of the first embodiment will be described.

Figure 2:
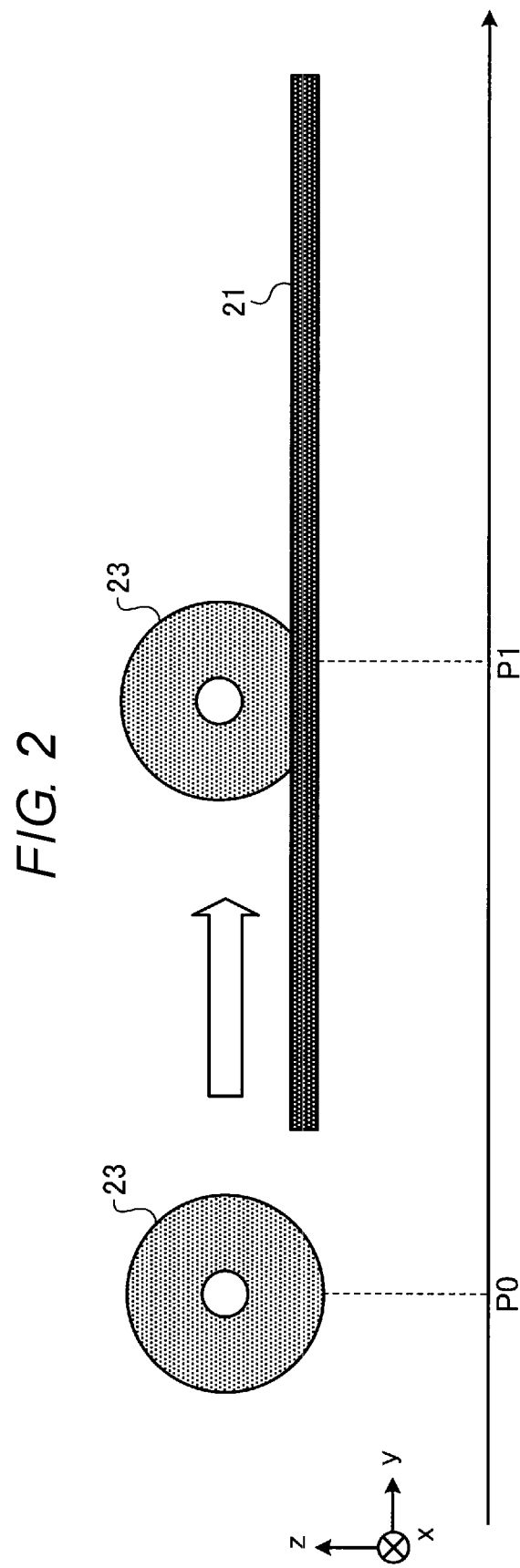
FIG. 2 is an explanatory diagram of a dicing operation.
Figure 3:
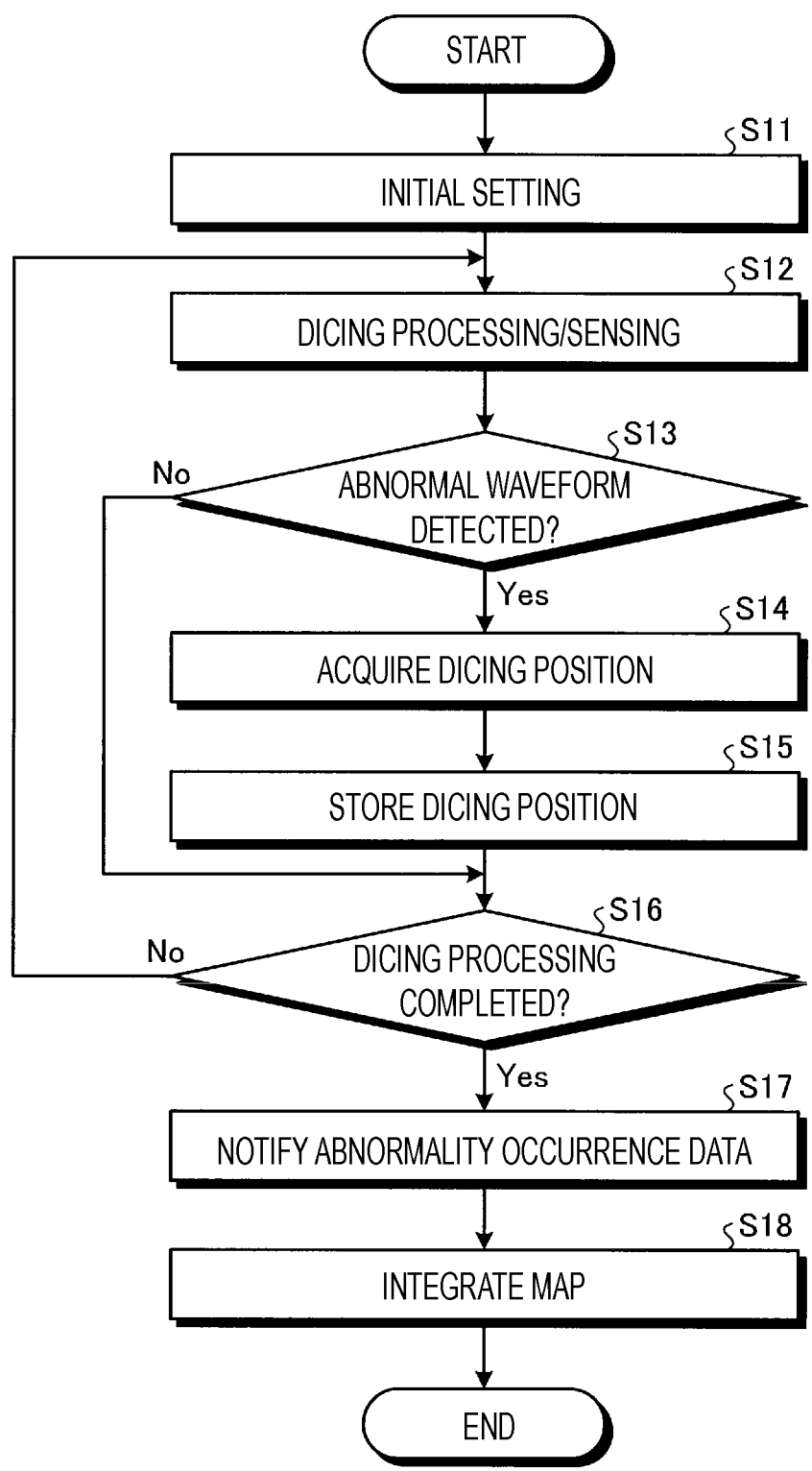
FIG. 3 is an operation flowchart of the embodiment.

FIG. 2 is an explanatory diagram of a dicing operation.
FIG. 3 is an operation flowchart of the embodiment.

First, the drive mechanism 26 rotates the chuck table 22 that holds the wafer 21 to perform an initial setting so that an extension direction of the target scheduled cutting line matches a direction of the blade 23 of the dicing apparatus 11 located at position P0 (step S11).

Then, a lower end of the blade 23 is moved to a position lower than a surface of the wafer 21.

Thereafter, while the blade 23 is rotated, as illustrated in FIG. 2, the chuck table 22 is moved to the left in FIG. 2 by the drive mechanism 26, the blade 23 is relatively moved to the right to cut the wafer 21 along a predetermined scheduled cutting line, and a dicing is performed to cut the wafer 21 at cutting position P1 (step S12).

In parallel, the sensor unit 25 performs a sensing of detecting a spindle resistance, which is a resistance value of a spindle motor that rotationally drives the blade 23 (not illustrated), and outputs the sensing result to the controller (step S12).

Accordingly, the controller 27 outputs the dicing position and the sensing result to the abnormality analysis apparatus 12.

The abnormality analysis apparatus 12 functions as a fault detection and classification (FDC) and determines whether an abnormal waveform has been detected based on the sensing result of the sensor unit (step S13).

Here, the abnormal waveform will be described.

Figure 4:
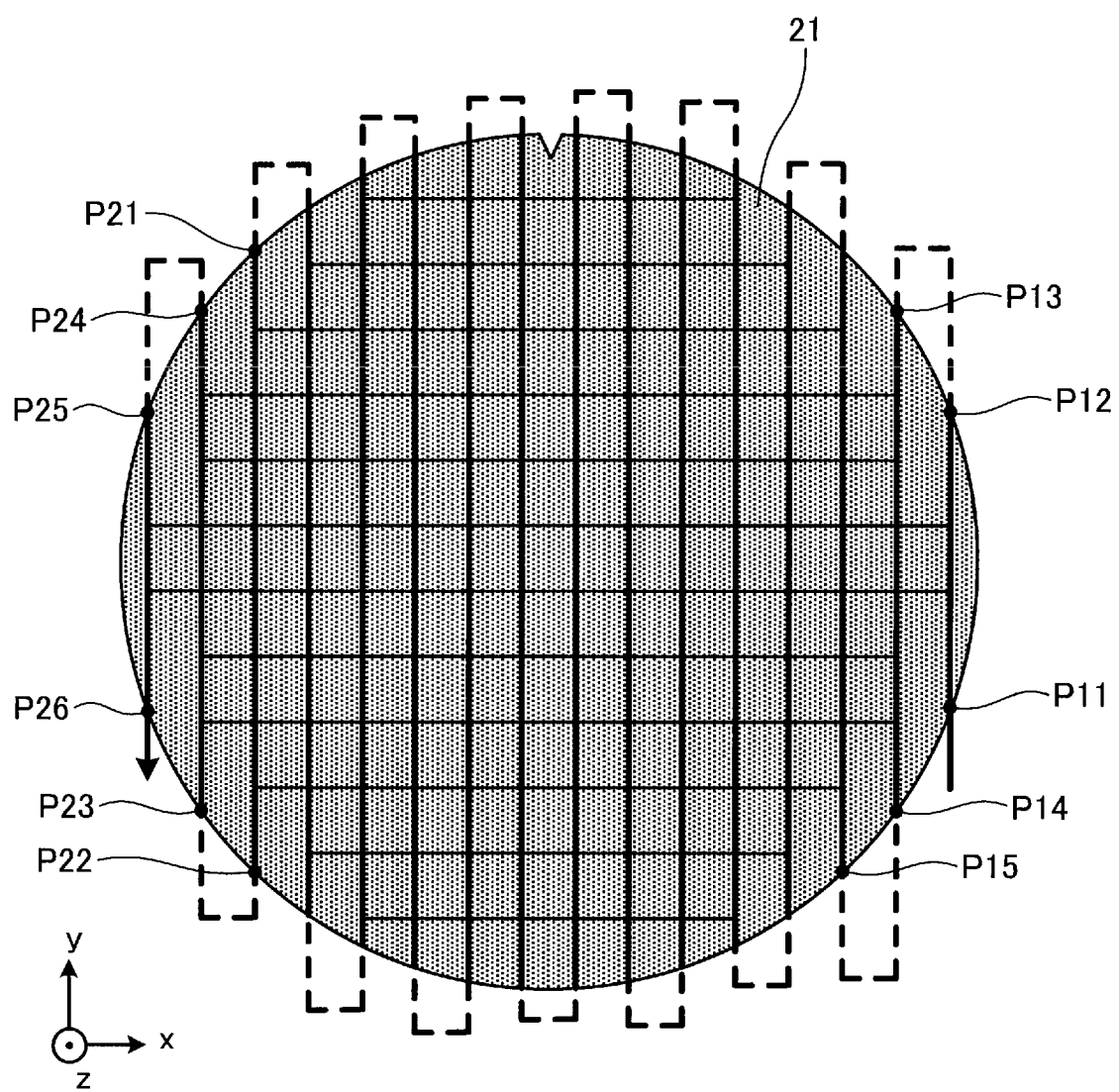
FIG. 4 is an explanatory diagram of a wafer dicing state.

FIG. 4 is an explanatory diagram of a wafer dicing state.

As illustrated in FIG. 4, the blade 23 starts cutting from position P11 and cuts to position P12 along the y direction.

Subsequently, the blade 23 is driven in the −x direction by the drive mechanism 26, and at this time, the cutting is started from position P13, and the cutting is performed along the −y direction to position P14.

The blade 23 is then driven in the −x direction by the drive mechanism 26, and at this time, the cutting is started from position P15 and the cutting is continued.

When the cutting further proceeds and the blade 23 reaches position P21, the cutting is started and performed along the −y direction to position P22. Then, the blade 23 is driven again in the −x direction by the drive mechanism 26, and at this time, the cutting is started from position P23, and the cutting is performed along the y direction to position P24.

Further, the blade 23 is driven in the −x direction by the drive mechanism 26, and at this time, the cutting is started from position P25, the cutting is performed along the −y direction to position P26, and the dicing in the wafer direction shown in FIG. 4 is ended.

Figure 5A:
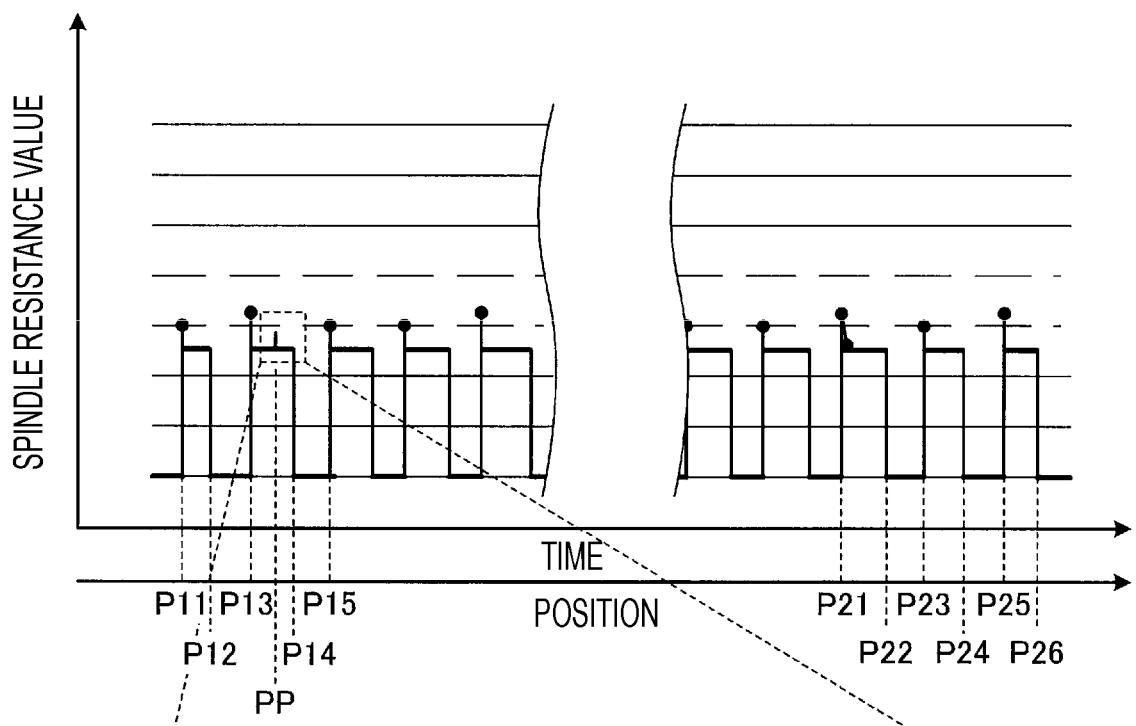
FIGS. 5A and 5B are diagrams illustrating a change in spindle resistance as a sensing result.
Figure 5B:
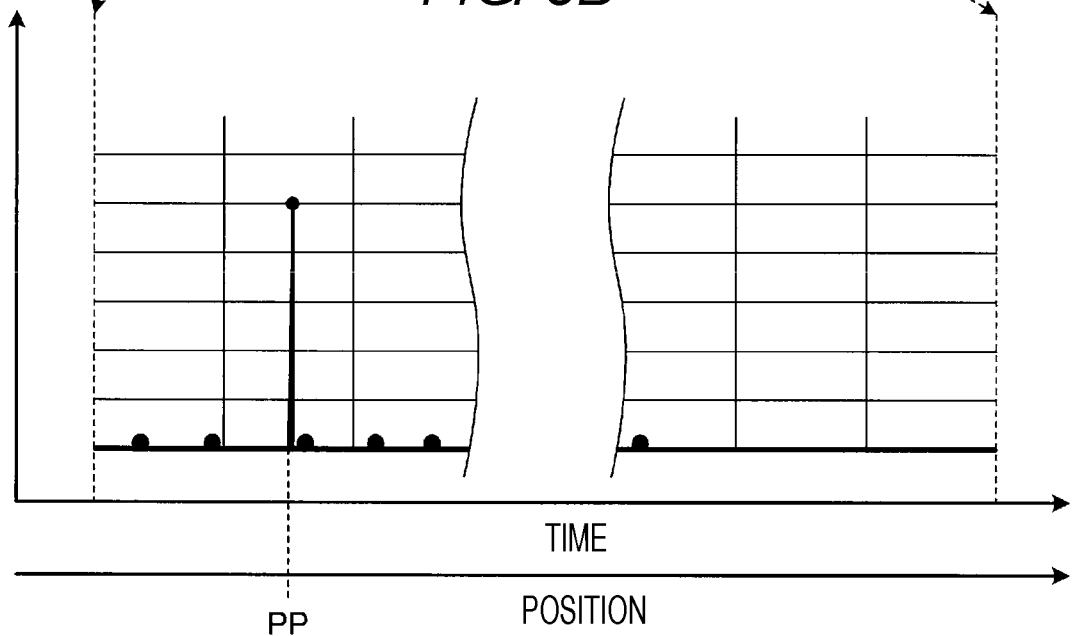

FIGS. 5A and 5B are diagrams illustrating a change in spindle resistance as a sensing result.

FIGS. 5A and 5B illustrate the position and time when the dicing process of FIG. 4 is performed.

FIG. 5A is a waveform overview diagram of the output signal of the sensor unit 25, and FIG. 5B is a partially enlarged view of a broken line frame portion in FIG. 5A.

In FIG. 5A, each waveform in the rectangular wave shape represents a change in the spindle resistance from the start of cutting the wafer 21 from one end thereof (corresponding to the position P11) to the other end thereof (corresponding to the position P12) to the end of the cutting (corresponding to the position P26).

That is, it may be seen that at the start of cutting at either end of the wafer 21 (e.g., position P11), the spindle resistance value increases rapidly, and when the cutting of the wafer 21 is actually started, such a value becomes a substantially constant value and decreases rapidly at the end of the cutting where the other end thereof is reached (e.g., position P12).

Then, after the chuck table 22 is rotated, the position of the blade 23 in the y direction (see FIG. 3) is set, and the cutting of the wafer 21 is started again. Therefore, when the spindle resistance value increases rapidly and the cutting in the x direction or the −x direction is continuously performed, a substantially constant value is continued, and when the cutting is completed, the value rapidly decreases again.

At this time, when chipping occurs, the spindle resistance value which is expected to be substantially constant during cutting increases rapidly, as illustrated by position PP in FIG. 5B, and immediately returns to a substantially constant value represented during cutting.

Therefore, when the spindle resistance value during cutting temporarily increases rapidly and immediately returns to a substantially constant value indicating that cutting is in progress, the abnormality analysis apparatus 12 determines that there is a high possibility that chipping occurred based on the output of the controller 27, acquires a dicing position (position PP in the example of FIG. 5B) at the detection timing (step S14), and stores the acquired dicing position in association with the spindle resistance value as an abnormality detection position (step S15).

In this case, the dicing position (the position PP in the above example) is calculated based on a distance calculated from the processing time and the processing speed and information on the processing position grasped by the dicing apparatus 11.

Subsequently, the abnormality analysis apparatus 12 determines whether the dicing processing on the wafer 21 has been completed (step S16).

When the dicing processing on the wafer 21 has not yet been completed in the determination in step S16 (step S16; "No"), the process proceeds to a standby state to perform dicing processing and sensing, and the process proceeds again to steps S12 and S13.

When the dicing processing on the wafer 21 has been completed in the determination in step S16 (step S16; "Yes"), all the dicing positions associated with the stored spindle resistance values are notified to the integrated production information system 13 as abnormality occurrence data (step S17).

Thus, the integrated production information system 13 refers to its own database and further records, to the wafer map data in which all the wafer data from the wafer processing step to the wafer testing step corresponding to the wafer 21 to be processed is recorded, information on the abnormality detection position and the chip position where the abnormality may have occurred (step S18).

As a result, when the mapping data is displayed based on the wafer map data in which the information of the abnormality detection position and the chip position where an abnormality may have occurred is further recorded, it is possible to easily identify the abnormality occurrence location of the target wafer 21. Further, by comparing the wafer map data with wafer map data of other wafers 21 in a same lot, it becomes possible to grasp a relationship with the wafer processing step or the wafer testing step.

Figure 6:
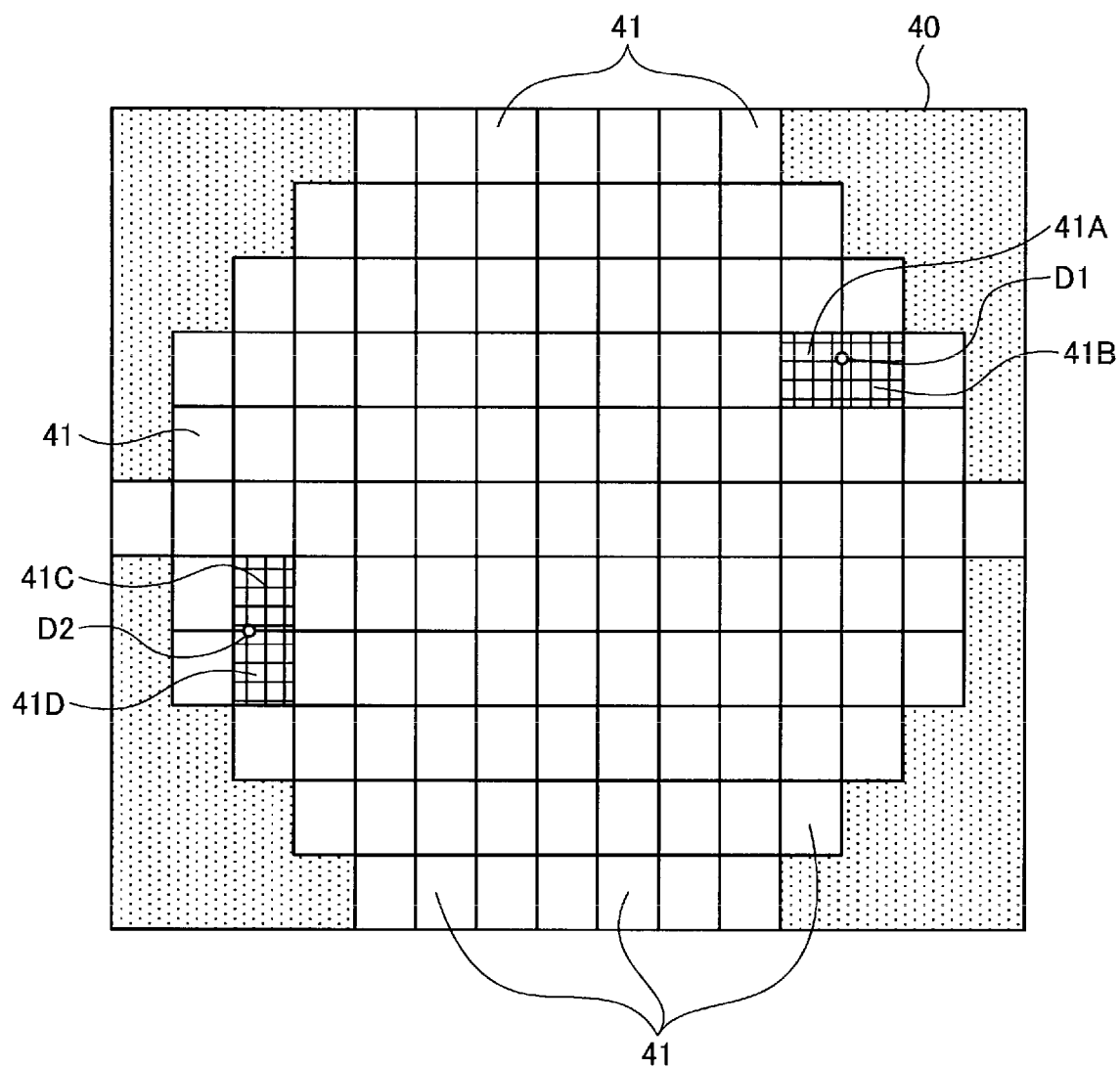
FIG. 6 is an explanatory diagram of a display example of mapping data.

FIG. 6 is an explanatory diagram of a display example of mapping data.

As a general format of wafer map file, a TSK format, a G85 format, a KRF format, and the like are known, and FIG. 6 illustrates the TSK format as an example.

In the displayed mapping data 40, a plurality of chip areas 41 corresponding to the plurality of chips formed on the wafer are displayed, and the chip area 41 in which no abnormality is detected is displayed in a predetermined color (white in the case of FIG. 6).

In contrast, when any abnormality is detected, the chip area 41 is displayed in a predetermined color corresponding to the abnormality content (hatching in the example of FIG. 6).

In the example of FIG. 6, the mapping data 40 displays abnormality detection positions D1 and D2 that may have the above-described chipping or the like.

Further, in the mapping data 40, chip areas 41A and 41B are displayed in a predetermined color as information of chip positions where an abnormality may occur based on the abnormality detection position D1.

Similarly, in the mapping data 40, chip areas 41C and 41D are displayed in a predetermined color as information of chip positions where an abnormality may occur based on the abnormality detection position D2.

Therefore, it is possible to easily and visually recognize a position on the wafer 21 where there is a high possibility of abnormality. Further, by referring to the information recorded in the mapping data based on other processes or other tests, it also becomes possible to estimate or consider a countermeasure against the cause of the abnormal wafer detected at this time in the manufacturing process or processing step.

In addition, by outputting the mapping data in which the abnormal part obtained by the dicing processing is specified to the post-stage apparatus 14, it is possible to improve the efficiency of the post-stage inspection process or the processing step.

Specifically, for example, when the post-stage apparatus 14 is an inspection apparatus for chipping inspection, since an inspection may be performed in a state in which a chip area having a high possibility of chipping is specified, it becomes possible to improve inspection efficiency. Further, when the post-stage apparatus 14 is a processing apparatus, effective processing efficiency may be improved by not performing processing on a chip area that is likely to be a defective product.

[2] Second Embodiment

In the first embodiment described above, the sensor unit includes one type of sensor as a sensor of grasping processing location information and detecting abnormality. However, a second embodiment is related to a case where the sensor unit 25 includes two types of sensors as a sensor of grasping processing location information and detecting abnormality.

Specifically, as in the first embodiment, the sensor unit 25 constitutes the blade drive unit 24, and includes a first sensor that detects a spindle resistance that is a resistance value of a spindle motor that rotationally drives the blade 23 (not illustrated), the driving current value of the spindle motor, and the like, and a second sensor configured as an acceleration sensor that detects acceleration generated in the blade 23 during dicing, or a time of flight (TOF) sensor that detects a relative distance from the wafer 21 during dicing.

In the following description, a case where an acceleration sensor is used as the second sensor will be described as an example.

Figure 7A:
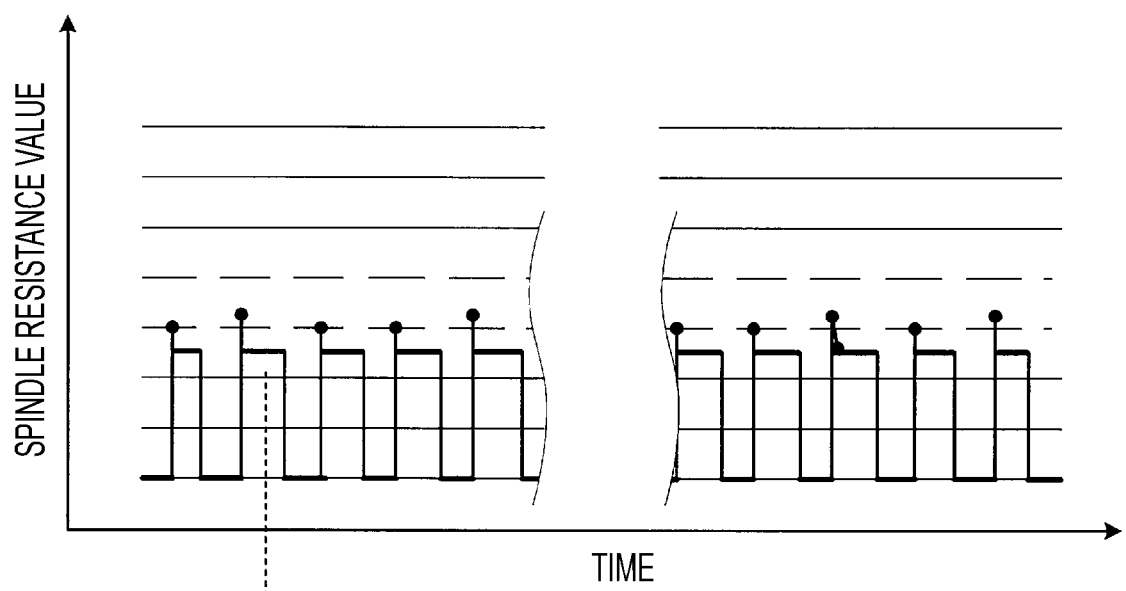
FIGS. 7A and 7B are diagrams illustrating a change in spindle resistance and a change in acceleration as sensing results.
Figure 7B:
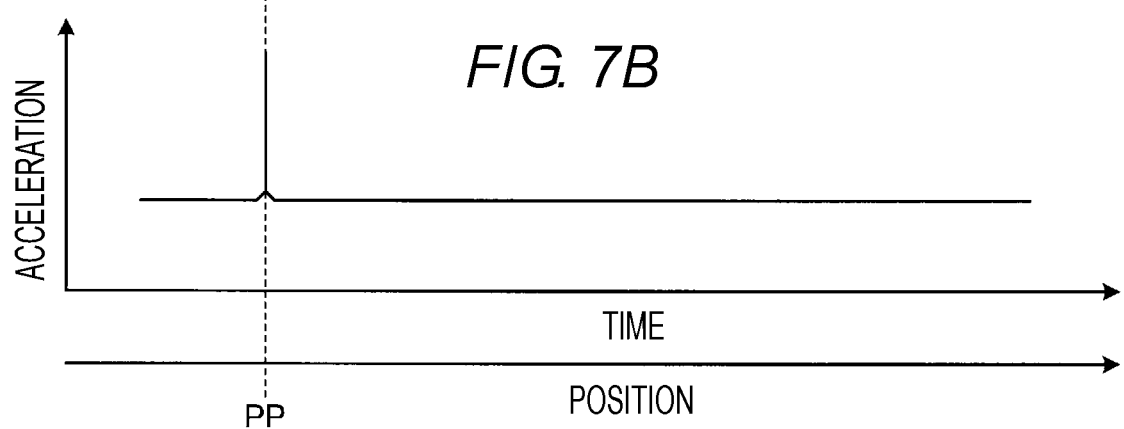

FIGS. 7A and 7B are diagrams illustrating a change in spindle resistance and a change in acceleration as sensing results.

FIG. 7A is a schematic waveform diagram corresponding to the spindle motor resistance value measured by the first sensor, and FIG. 7B is a schematic waveform diagram corresponding to the acceleration measured by the second sensor.

Further, the acceleration sensor does not perform measurement when the blade moves during the dicing process.

In FIG. 7A, each of the rectangular waveforms represents a change in the spindle resistance values from the start of cutting the wafer 21 from one end thereof (corresponding to the position P11 in FIG. 4) to the other end thereof (corresponding to the position P12 in FIG. 4) to the end of the cutting (corresponding to the position P26 in FIG. 4).

Similarly, FIG. 7B represents a change in the acceleration from the start of the cutting of the wafer 21 from one end thereof (corresponding to the position P11 in FIG. 4) to the other end thereof (corresponding to the position P12 in FIG. 4) to the end of the cutting (corresponding to the position P26 in FIG. 4).

As described above, it may be seen that at the start of cutting at either end of the wafer 21 (e.g., the position P11 in FIG. 4), the spindle resistance value increases rapidly, and when the cutting of the wafer 21 is actually started, such a value becomes a substantially constant value and decreases rapidly at the end of the cutting where the other end of the wafer 21 is reached (e.g., the position P12 in FIG. 4).

Meanwhile, when there is no abnormality, the acceleration sensor represents a substantially constant value, and when chipping or the like occurs at the abnormality detection position PP, the acceleration sensor increases only when an abnormality is detected, and immediately returns to a substantially constant value.

Therefore, when the spindle resistance value during cutting increases by cutting and becomes a substantially constant value and the acceleration temporarily increases rapidly and immediately returns to a substantially constant value, the abnormality analysis apparatus 12 determines that there is a high possibility that chipping occurred and acquires the dicing position (position PP in the example of FIGS. 7A and 7B) at the detection timing with reference to the spindle resistance value of FIG. 7A, and uses the acquired dicing position as the abnormality detection position.

Also in this case, as in the first embodiment, the dicing position (position PP in the above example) is calculated based on the distance calculated from the processing time and the processing speed, and information on the processing position grasped by the dicing apparatus 11.

Subsequently, the abnormality analysis apparatus 12 determines whether the dicing processing on the wafer 21 has been completed. When it is determined that the dicing processing on the wafer 21 has not been completed, the abnormality analysis apparatus 12 proceeds to a standby state to perform dicing processing and sensing, and continues dicing.

Meanwhile, when it is determined that the dicing processing has been completed, all of the dicing positions calculated in association with the abnormality detection timing in the acceleration sensor as the second sensor are notified to the integrated production information system 13 as abnormality occurrence data. The integrated production information system 13 refers to its own database and further records information on abnormality detection position and the position of the chip where an abnormality may have occurred in the wafer map data in which all wafer data from the wafer processing step corresponding to the wafer 21 to be processed to the wafer test step is recorded.

As a result, according to the second embodiment, it is possible to specify the abnormality occurrence location of the target wafer 21 more reliably than in the first embodiment in which the abnormality state is detected by one type of sensor.

[3] Third Embodiment

Figure 8:
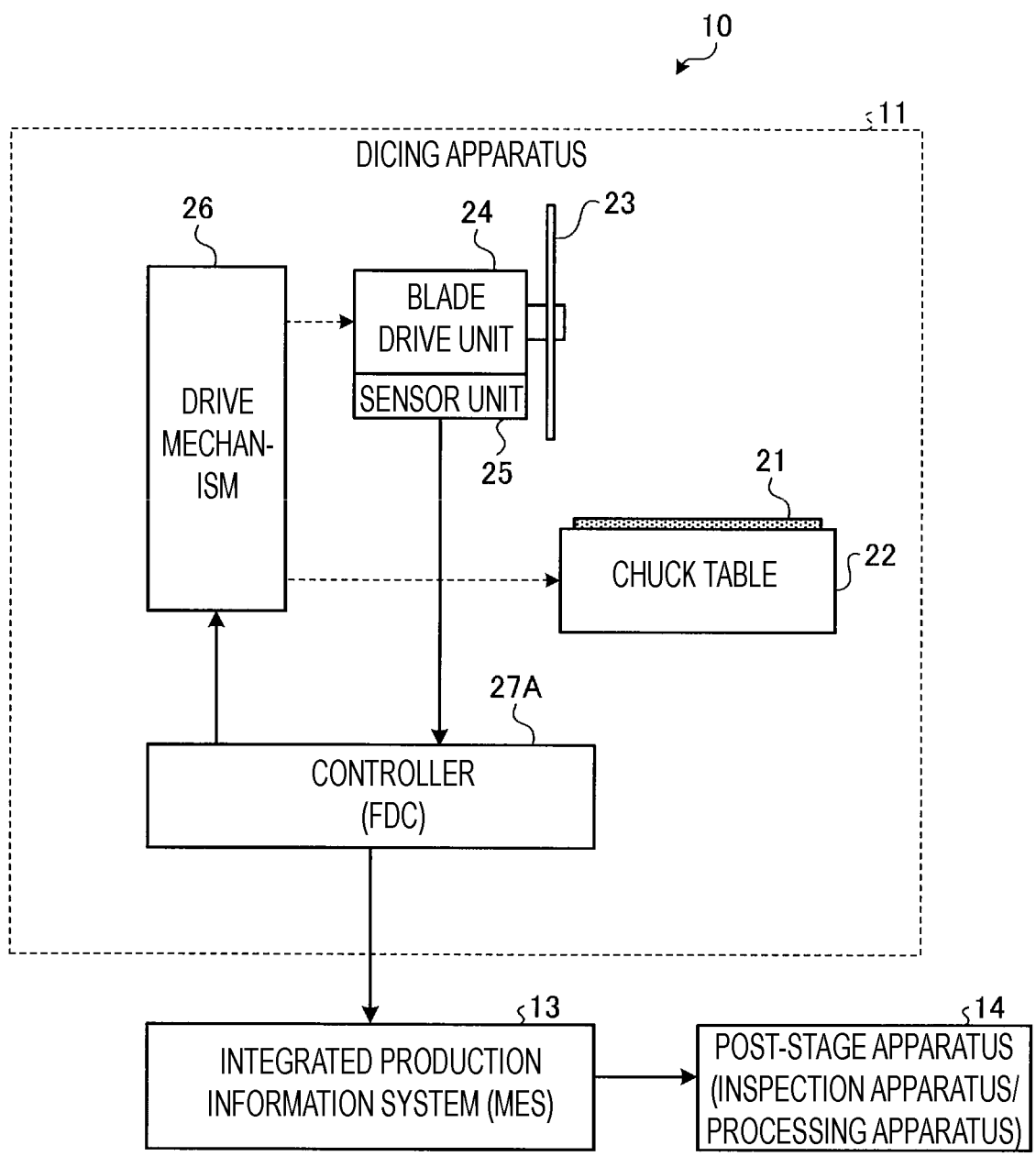
FIG. 8 is a schematic configuration block diagram of a semiconductor processing system according to a third embodiment.

FIG. 8 is a schematic configuration block diagram of a semiconductor processing system according to a third embodiment.

In FIG. 8, the same parts as those in FIG. 1 are denoted by the same reference numerals.

The third embodiment is different from the first embodiment in that a controller 27A that implements the function of the abnormality analysis apparatus 12 according to the first embodiment is provided instead of the controller 27.

As a result, when the spindle resistance value during cutting temporarily increases rapidly and immediately returns to a substantially constant value indicating that cutting is in progress, the controller 27A determines that there is a high possibility that chipping occurred base on the output of the sensor unit 25, acquires a dicing position at the detection timing, and stores the acquired dicing position as an abnormality detection position in association with the spindle resistance value. In this case, the dicing position is calculated based on the distance calculated from the processing time and the processing speed, and information on the processing position grasped by the controller 27A as the dicing apparatus 11.

Subsequently, the controller 27A determines whether the dicing processing on the wafer 21 has been completed. When it is determined that the dicing processing on the wafer 21 has been completed, the controller 27A notifies the dicing position associated with the stored spindle resistance value to the integrated production information system 13.

As a result, the integrated production information system 13 performs the same process as in the first embodiment.

Therefore, according to the third embodiment, the same effect as that of the first embodiment may be obtained more simply by linking the dicing apparatus 11 as a processing apparatus to the integrated production information system 13.

Also in this case, as in the second embodiment, the first sensor and the second sensor may be provided that detect abnormality more reliably.

[4] Fourth Embodiment

Figure 9:
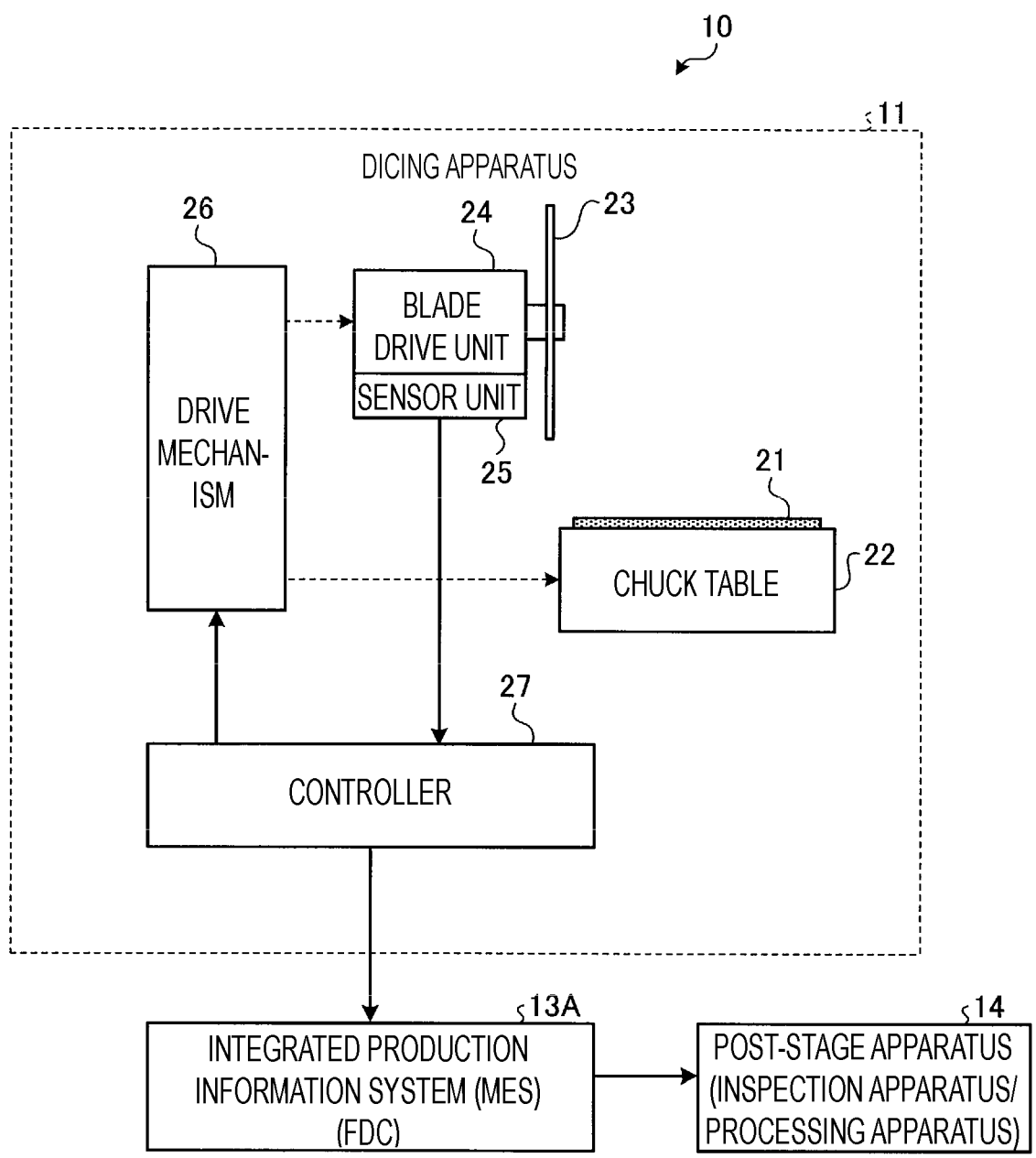
FIG. 9 is a schematic configuration block diagram of a semiconductor processing system according to a fourth embodiment.

FIG. 9 is a schematic configuration block diagram of a semiconductor processing system according to a fourth embodiment.

In FIG. 9, the same parts as those in FIG. 1 are denoted by the same reference numerals.

The fourth embodiment is different from the first embodiment in that instead of the integrated production information system 13, an integrated production information system 13A is provided that implements the function of the abnormality analysis apparatus 12 according to the first embodiment and functions as a processing information management system alone. According to this configuration, the controller 27 outputs the dicing position and the sensing result to the integrated production information system 13A.

The integrated production information system 13A also functions as a fault detection and classification (FDC), determines whether an abnormal waveform is detected based on the sensing result of the sensor unit 25 output by the controller 27, determines that there is a high possibility that chipping occurred when the spindle resistance value during cutting temporarily increases rapidly and immediately returns to a substantially constant value indicating that cutting is in progress, acquires the dicing position at the detection timing, and stores the acquired dicing position in association with the spindle resistance value as the abnormality detection position. In this case, the dicing position is calculated based on the distance calculated from the processing time and the processing speed, and information on the processing position grasped by the controller 27 as the dicing apparatus 11.

Subsequently, the integrated production information system 13A determines whether the dicing processing on the wafer 21 has been completed. When it is determined that the dicing processing on the wafer 21 has been completed, the integrated production information system 13A performs the same process as in the first embodiment.

Therefore, according to the fourth embodiment, similarly to the third embodiment, the same effect as in the first embodiment may be obtained more simply by linking the dicing apparatus 11 as a processing apparatus to the integrated production information system 13A functioning as a processing information management system alone.

Also in this case, as in the second embodiment, the first sensor and the second sensor may be provided that detect abnormality more reliably.

The controller, the abnormality analysis apparatus, or the integrated production information system of the present embodiment has a hardware configuration using a normal computer.

A program executed by the controller, the abnormality analysis apparatus, or the integrated production information system of the present embodiment is a file in an installable format or an executable format, and is provided by being recorded on a computer-readable recording medium including, for example, a recording medium such as a digital versatile disk (DVD) or a semiconductor storage device such as a USB or a solid state drive (SSD).

Further, the program executed by the controller, the abnormality analysis apparatus, or the integrated production information system of the present embodiment may be stored on a computer connected to a network such as the Internet and provided by being downloaded via the network.

In addition, the program executed by the controller, the abnormality analysis apparatus or the integrated production information system of the present embodiment may be configured to be provided or distributed via a network such as the Internet.

Further, the program executed by the controller, the abnormality analysis apparatus, or the integrated production information system of the present embodiment may be provided by being incorporated in advance in a ROM or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A processing information management system comprising:
   a wafer processing apparatus that includes a dicing apparatus having a rotable blade driven by a motor, the dicing apparatus configured to dice a wafer;
   a first sensor provided in the wafer processing apparatus, the first sensor outputting a first sensor signal according to a detected processing state, and the first sensor signal includes at least one of a signal corresponding to a spindle resistance value of the motor or a signal corresponding to a driving current of the motor;

an abnormality analyzer configured to generate abnormality occurrence data of a target wafer based on processing location information based on the first sensor signal;

an integration system configured to integrate the abnormality occurrence data into wafer map data corresponding to the target wafer;

the integration system further configured to output the wafer map data to a post stage apparatus configured to perform a post-processing on the target wafer; and the post stage apparatus configured to perform a post-processing on the target wafer based on the wafer map data.

2. The processing information management system according to claim 1, wherein the wafer processing apparatus includes a second sensor configured to output a second sensor signal according to a detected abnormality state, the second sensor is an acceleration sensor, and the second sensor signal includes an acceleration signal indicating an acceleration value of the blade, and the abnormality analyzer is configured to generate the abnormality occurrence data using the processing location information based on the first sensor signal and the abnormality state based on the second sensor signal.

3. The processing information management system according to claim 1, wherein the wafer processing apparatus includes a second sensor configured to output a second sensor signal according to a detected abnormality state, the second sensor is a time of flight (TOF) sensor, and the second sensor signal includes a distance signal indicating an distance value from the target wafer to the blade, and the abnormality analyzer is configured to generate the abnormality occurrence data using the processing location information based on the first sensor signal and the abnormality state based on the second sensor signal.

4. The processing information management system according to claim 1, wherein the detected processing state includes an increase of the spindle resistance value of the motor above a predetermined level.

5. The processing information management system according to claim 1, wherein the abnormality analyzer is configured to detect chipping generated in dicing the wafer.

6. The processing information management system according to claim 1, wherein the integration system is configured to display integrated wafer map data into which the abnormality occurrence data is integrated.

7. The processing information management system according to claim 6, wherein the integration system is configured to display locations of chip areas and an abnormality position on the wafer as the integrated wafer map data.

8. The processing information management system according to claim 1, wherein the integration system is configured to output integrated wafer map data into which the abnormality occurrence data is integrated to an inspection apparatus.

9. The processing information management system according to claim 1, wherein the integration system is configured to output integrated wafer map data into which the abnormality occurrence data is integrated to a processing apparatus configured to perform a post-processing after dicing processing in semiconductor manufacturing.

10. A method of managing processing information comprising:

dicing a wafer by a wafer processing apparatus that includes a dicing apparatus having a rotable blade driven by a motor;

sensing, by a first sensor provided in the wafer processing apparatus, a first sensor signal according to a detected processing state, and the first sensor signal includes at least one of a signal corresponding to a spindle resistance value of the motor or a signal corresponding to a driving current of the motor;

generating, by an abnormality analyzer, abnormality occurrence data of a target wafer based on processing location information based on the first sensor signal;

integrating, by an integration system, the abnormality occurrence data into wafer map data corresponding to the target wafer;

outputting, by the integration system, the wafer map data to a post stage apparatus configured to perform a post-processing on the target wafer; and post-processing, by the post stage apparatus, the target wafer based on the wafer map data.

11. The method according to claim 10, wherein the detected processing state includes an increase of a spindle resistance value of a motor above a predetermined level, the motor being configured to rotationally drive a blade to dice the target wafer.

12. The method according to claim 10, further comprising:

displaying locations of chip areas and an abnormality position on the wafer as integrated wafer map data into which the abnormality occurrence data is integrated.

13. The method according to claim 10, further comprising:

outputting integrated wafer map data into which the abnormality occurrence data is integrated to an inspection apparatus.

14. The method according to claim 11, wherein the abnormality occurrence data includes location information of chipping generated in dicing the target wafer.

* * * * *